Figure 1:
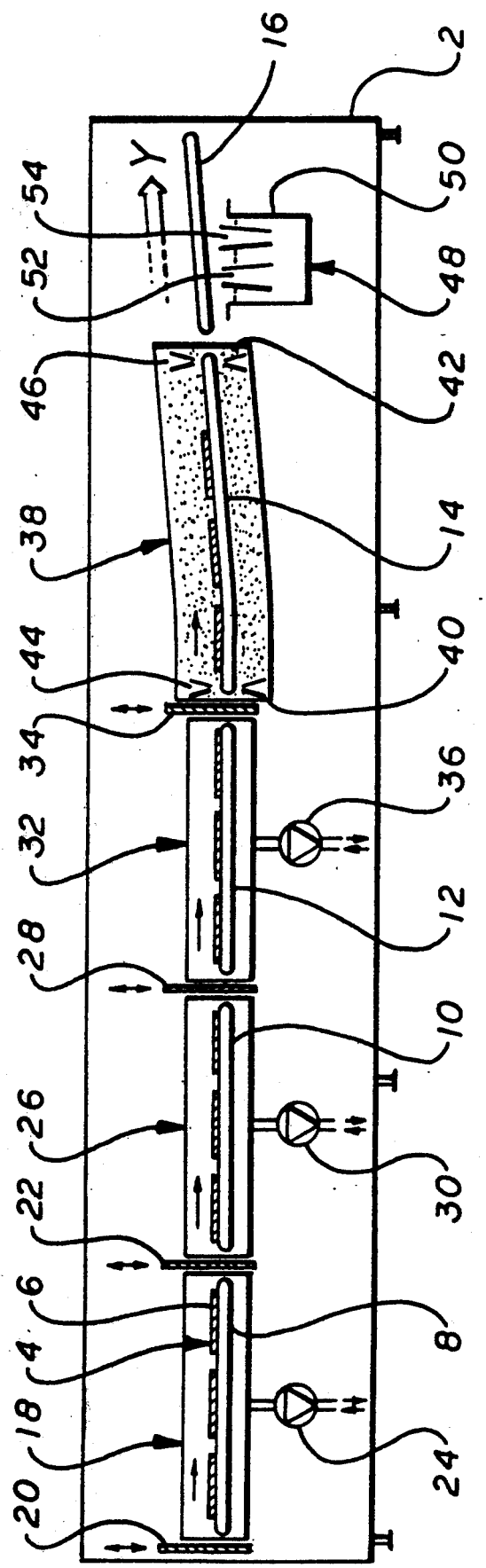

United States Patent [19]

Liedke et al.

[11] Patent Number: 5,193,739
[45] Date of Patent: Mar. 16, 1993

[54] PROCESS AND DEVICE FOR SOLDERING ELECTRONIC BOARDS, IN PARTICULAR, PRINTED CIRCUIT BOARDS WITH DEVICES INSTALLED ON THEM

[75] Inventors: Volker Liedke, Elsenfeld/Eichelsbach; Karl-Heinz Grasmann, Stadtprozelten; Hans-Jürgen Albrecht, Berlin; Harald Wittrich, Berlin; Wilfred John, Berlin; Wolfgang Scheel, Berlin, all of Fed. Rep. of Germany

[73] Assignee: WLS Karl-Heinz Grasmann, Faulbach, Fed. Rep. of Germany

[21] Appl. No.: 810,708

[22] Filed: Dec. 18, 1991

[30] Foreign Application Priority Data

Dec. 21, 1990 [DE] Fed. Rep. of Germany ....... 4041270

[51] Int. Cl.⁵ ............................ B23K 1/20; B08B 7/00
[52] U.S. Cl. .................................. 228/205; 228/206; 134/19; 134/31
[58] Field of Search ................ 228/206, 205, 239; 134/19, 31

[56] References Cited

U.S. PATENT DOCUMENTS

| | | | |
|---|---|---|---|
| 2,136,392 | 11/1938 | Murphy | 134/19 |
| 3,484,288 | 12/1969 | Niedner et al. | 134/31 |
| 4,986,463 | 1/1991 | Zimmer | 228/205 |

FOREIGN PATENT DOCUMENTS

| | | | |
|---|---|---|---|
| 53-15010 | 5/1978 | Japan | 134/19 |
| 2-174190 | 7/1990 | Japan | 228/206 |

Primary Examiner—Richard K. Seidel
Assistant Examiner—Jeffrey T. Knapp
Attorney, Agent, or Firm—Roth & Goldman

[57] ABSTRACT

In the process according to the invention for soldering electronic boards, in particular, printed circuit boards with devices installed on them, first, during the pickling process, a condensable process material, for example, water, is introduced into flaws in the oxide layers on the soldering connection surfaces and at least partially condensed in the flaws. Then, the oxide layers are exposed to rapid heating such that the process material condensed in the flaws vaporizes explosively and thus the oxide layer breaks up and cracks off of the basis material, such that the soldering connection surfaces for the subsequent actual soldering process are brought to virgin condition. In the case of wave soldering, the rapid heating occurs preferably by means of the wave of solder itself. If non-oxide passive layers must also be removed, this occurs preferably in a preceding stage of the pickling process, during which the oxide layer is hydrophilized. For this, a plasma pretreatment is suitable. The device according to the invention has a moisturizing chamber in which the condensable process material is supplied to the hydrophilic oxide layers and absorbed by them.

18 Claims, 2 Drawing Sheets

PROCESS AND DEVICE FOR SOLDERING ELECTRONIC BOARDS, IN PARTICULAR, PRINTED CIRCUIT BOARDS WITH DEVICES INSTALLED ON THEM

The invention concerns a process for soldering electronic boards, in particular, printed circuit boards with devices installed on them as well as to a device for performance of this process.

Although the invention is fundamentally suitable for soldering electronic boards o any type, it is explained in the preferred field of application, ile., soldering printed boards with devices installed on them. This involves assembly with chip on board (COB) devices, with through-hole-mounted (THM) devices, and with surface mounted devices (SMD) as well as with mixed types of mounting.

The share of complex electronic boards with high reliability requirements is constantly increasing. This makes it essential to process SMD and THM components on printed boards individually or in combination as mixed assemblies. For this, the devices are placed on the solder connection surfaces of the printed circuit board by means of a suitable, largely automated mounting process. With pure SMD assemblies, the attachment of the devices is accomplished primarily by the use of paste solders. In assemblies with mixed types of mounting with SMD and THM devices, the THM devices are physically installed by formfitting and the SMD devices are attached to the soldering side by means of a suitable adhesive. To produce the material connection between the solder connection surfaces of the devices and the printed circuit board, it must be possible for the solder connection surfaces to be wetted by the solder during the actual soldering process. However, frequently and in fact usually, so-called passive layers, which are oxide layers and organic and/or inorganic contamination layers, are found on the solder connection surfaces. These passive layers hinder the access of the solder to the solder connection surfaces and must therefore usually be pickled, i.e., removed from the metal basis material.

Therefore, it is basic knowledge to perform a pickling process before the actual soldering process. Consequently, prior art devices have a pickling system by means of which the oxide layers present at least on the solder connection surfaces are largely removed, in addition to a soldering system, by means of which the solder connection surfaces are wetted with molten solder.

It is known to perform pickling with a flux which is applied by means of a pickling system with an arrangement to apply the flux to the parts to be joined. The flux reacts with the passive layers and removes them, for example, by forming complexes. It must play the additional role of preventing the formation of new passive layers before wetting with molten solder. Furthermore, it can reduce the surface tension of the solder and prevent formation of bridges between adjacent solder points, and finally, the flux retards the formation of oxide skins on the fresh solder points, so that they can be formed in the desired configuration.

However, flux residues can have a negative effect on the electrical function of the board and can have a corrosive effect on the devices and the printed circuit board. To assure reliable electrical functioning of the board, it is thus essential to remove the flux residues in a subsequent wet chemical cleansing process. Formerly common was a cleansing bath of chlorofluorohydrocarbons (CFH's) or chlorohydrocarbons (CHC's). The efforts to reduce environmental pollution through CFHC- and CHC-containing fluids have led to high investments for waste gas and waste water purification, which significantly increase the expense of soldering procedures which use flux.

Attempts must therefore be made to use low-flux or flux-free processes for soldering electronic boards.

A process is known for soldering electronic boards (German Utility Model 85 20 254), whereby the pickling is performed with the help of a protective gas which acts to reduce the oxide layers and whereby the protective gas is preferably a nitrogen-hydrogen mixture. The board is exposed to this protective gas in a gassing chamber upstream from the soldering device, which in this prior art case forms the pickling device. Because of the oxide-layer-reducing effect of the protective gas, flux-free soldering of the boards is supposed to be possible. However, problems can be caused by the reducing effect is not limited to the oxide layers, by the measures which are essential to prevent the formation of explosive air-protective gas mixtures, and by the high processing temperatures required.

The objective of the invention is to provide a process and apparatus for soldering electronic boards, which makes it possible to avoid the use of supporting pickling agents in the form of fluxes as well as rendering unnecessary the subsequent cleansing of soldered boards which is required when fluxes are used.

This objective is met according to the invention with regard to the process in that first, during the pickling process, a condensable process material is introduced for absorption in flaws in the oxide layers and is at least partially condensed in the flaws, and then the oxide layers are exposed to rapid heating such that the process material condensed in the flaws vaporizes explosively and thus the oxide layer breaks up and cracks off of the metal basis material.

Oxide layer structures generally have many three-dimensional flaws in the layers, which, among other things, can increase with the thickness of the layer. The total surface area of these three-dimensional flaws in the form of microscopically small profiles, fissures, and holes in the otherwise closed surface exceeds the flat projection surface of a soldering connection surface many times over. With the invention, these flaws are now exploited to absorb an initially gaseous process material on their surfaces, which then at least partially condenses and thus fills the flaws with liquid. When heat is later rapidly applied to the oxide layers, the liquid in the flaws suddenly vaporizes. This is inevitably accompanied by a great expansion in the volume of the process material. If the increase in volume occurs rapidly enough, such high pressure builds up within the flaws that it breaks up the oxide layer and-and aided by the brittleness of the oxide layer and the lateral variations in its adhesion to the basis cracks it off of the metal basis material of the soldering connection surface in question. This surface is thus brought to its virgin, metallurgically reactive condition such that when, during the soldering process, solder meets these virgin surfaces, an undisturbed fit, wetting, and interface reaction can occur between the solid, i.e., the soldering connection surface, and the molten solder.

The mechanism of action of the above described process according to the invention is thus the rapid expansion in volume of the process material absorbed and condensed in the three-dimensional flaws in the oxide layer. The process must consequently be performed such that the process material is permitted to penetrate in gaseous phase into the flaws and to be absorbed there, that condensation of the process material in the flaws then occurs, and that, finally, enough heat reaches the condensed process material that its volume increases explosively. These conditions for performance of the process are relatively easy to meet: If the free surface of the oxide layer is adequately hydrophilic, it suffices to expose the soldering connection surfaces to a gas atmosphere containing the process material under suitable pressure and temperature, such that the process material penetrates into the flaws, is absorbed there, and finally condenses. Even the required rapid heating of the oxide layers presents no really difficult problem.

In the process according to the invention, the pickling of the oxide layers occurs through their physical cracking off in the micro-range. No flux is required to accomplish this. The process according to the invention thus permits flux-free soldering. Chemical reaction products do not appear with this type of pickling; thus, they neither need to be removed nor can they lead to soldering defects. Since the mechanism of action exploits specific structural properties of the oxide layers, the surfaces of the basis material under the oxide layer are not attacked during pickling. Finally, it should be noted that the older and thicker an oxide layer is, the more flaws it has into which the expandable process material can be introduced. In other words, the thicker and more disruptive an oxide layer is, the better it can be attacked and removed by the method provided according to the invention. This constitutes a significant difference compared to wet chemical pickling using a flux or even compared to pickling using a protective gas which reduces the oxide layers.

The process material used should have as low a molecular weight as possible and should be polar so that in the gaseous state it can diffuse into the flaws and be absorbed there. The boiling point of the process material is preferably higher than room temperature. Suitable process materials are water, methanol, acetone, and ethanol; however, this list of process materials is not exclusive.

Preferably, the entire assembled board is exposed to a gas atmosphere containing the process material in gaseous phase, which [atmosphere] can be air containing water as the process material. The conditions (pressure, temperature, relative humidity) must be such that the process material can penetrate in gaseous phase into the pores formed by the flaws and be absorbed there. Premature formation of drops on the surface of the oxide layer could lead to the pores being sealed by the formation of drops and the gaseous process material being unable to diffuse into the flaws. Consequently, such premature formation of drops is unsuitable.

Particularly if the process material is water, the gas mixture of air and the process material has the great advantage of simple preparation of this gas atmosphere and maximum possible environmental compatibility. Naturally, a pure process material atmosphere is also possible, for example, an atmosphere of 100% water vapor.

In the process according to the invention, the process material condensed in the flaws should be vaporized suddenly or explosively. This requires that, at the time the rapid heating occurs, an adequate amount of the process material liquid still be present in the oxide layer. It is therefore essential to prevent the condensed process material from gradually evaporating and escaping before the rapid heating. The gradual evaporation of the process material can be prevented simply by having the rapid heating follow the absorption and condensation by a short interval of time and/or by exposing the parts to be soldered to such conditions that no evaporation of the process material occurs, for example, in a climate chamber, after the condensation of the process material until the rapid heating.

In the rapid heating of the boards and with them the oxide layers with the infiltrated process material, the temporal temperature gradient in the oxide layer is preferably greater than 50 K./s, particularly greater than 150 K./s. Even significantly higher temporal temperature gradients of up to 500 K./s are appropriate and feasible. The supply of heat for the purpose of the rapid heating can take place by means of any suitable device, for example, by means of an IR heater and by means of a laser heater. If such a heater is used, this takes place preferably in a protective gas atmosphere such that the virginity of the soldering connection surfaces produced by the cracking off of the oxide layers is retained.

The supply of heat for the purpose of the rapid warming of the oxide layer, i.e., its heating, can take place immediately before the soldering process. Alternatively, it can also be performed at a certain interval before the soldering process, with it then being necessary to preserve the virgin surface created, preferably in a protective gas atmosphere, until the time of the soldering process.

However, in a particularly advantageous embodiment of the invention, provision may be made that the heating of the oxide layer with the absorbed process material take place during the soldering process by means of heat energy contained in the solder or added to it. In any case, the soldering process requires application of heat to the solder so that it is present in liquid phase and can wet the soldering connection surfaces. If—as preferably provided for—the amount of heat for the rapid heating of the oxide layer is taken from this heat supply, no rapid heating process step separated in time from the soldering process is necessary, but rather this process step occurs while the soldering connection surfaces are heated immediately before and during wetting with the molten solder.

It is possible to proceed in the above-mentioned manner, for example, with laser soldering or even with resistance soldering. However, heating directly by means of the solder wave is particularly advantageous in wave soldering. When the process according to the invention is performed in conjunction with a wave soldering process, this can take place such that the assembled board rides on the standing wave without the oxide layers having been previously removed from the soldering connection surfaces, but with the condensed process material already having been introduced into the oxide layers. When a specific surface element of a soldering connection surface is subjected to the flow-through of the wave of solder, the effect for this surface element is that it is suddenly heated upon its first contact with the wave of solder, such that the already described explosive volume expansion of the process material and the cracking off of the oxide layers occur. The oxide layers cracked off are flushed out by the wave of solder. The virgin soldering connection surface exposed under the cracked off oxide layer is covered immediately by the wave of solder such that the wave of solder itself serves as a protective liquid and, for example, rules out any new formation of oxides. Simultaneously with this protective coating of the virgin soldering connection surfaces, their wetting by the solder begins.

The above-described absorption of the gaseous process material into the flaws presupposes that it can enter into the flaws and that the surfaces on which the process material is to be absorbed are sufficiently hydrophilic. However, frequently the oxide layers on the soldering connection surfaces are contaminated by additional passive layers of an organic and/or inorganic nature, such that the surfaces of the oxide layer have no free bonds, since these are saturated by impurities, and are hydrophobic. For this reason, in an advantageous embodiment of the invention provision is made that during the pickling process before the absorption of the process material, a pretreatment is performed for removal of passive layers on the oxide layers. By this means, the pores in the oxide layer, if covered by passive layers, should be exposed, and the surface of the oxide layers should become hydrophilic.

This hydrophilization can occur through wet chemical means using a cleansing agent, with it being understood that the aggressiveness of this cleansing agent and the pollution of wastes caused by it can be less than in the case of a flux which is intended to eliminate the oxide layers as well as the organic and inorganic contamination layers.

In an advantageous embodiment of the invention, provision is made that the pretreatment occur with the help of a plasma to which the soldering connection surfaces are exposed. A plasma pretreatment of boards is part of the prior art technology based on the German patent application P 39 36 955.2, whereby in this prior art case the complete pickling including the oxide layers is attempted through a plasma pretreatment. In contrast to this, within the framework of the invention, the plasma pretreatment is performed for hydrophilization and not for removal of the oxide layers, so that it does not involve a reduction effect of the plasma. Through the plasma pretreatment, cavitation, i.e., the exposure of existing topological disruptions, is potentially and homogeneously supported in the oxide region.

Suitable process gases for the plasma are $O_2$, $N_2$, $H_2$, $CO_2$, $N_2O$, and $H_2O$ and especially air, whereby preferably processing takes place with a low-pressure plasma.

The condition obtained through the hydrophilization should still be present at the time that the absorptive infiltration of the process material occurs. Therefore, provision can be made in an advantageous embodiment of the invention that aeration of the board in hydrocarbon-free air take place between the plasma pretreatment and the absorptive infiltration of the process material. The absence of oxygen is not required at this time since the oxide layers are still present on the soldering connection surfaces anyway. It has been demonstrated that even several hours holding of plasma pretreated parts to be soldered under ambient conditions still does not make the soldering connection surfaces unsuitable for subsequent processing.

According to the invention, the device for soldering electronic boards has a moisturizing chamber in which a gas atmosphere containing the gaseous, condensable process material is present. The board stays in this moisturizing chamber for a controllable treatment period. The conditions of the gas atmosphere are adjustable such that the process material is absorbed in the oxide layers on the soldering connection surfaces of the parts to be soldered and at least partially condensed. The device according to the invention further distinguishes itself through a heater by means of which the oxide layers are rapidly heated following their moisturization by absorption and condensation of the process material. The moisturizing chamber has the advantage that the conditions during moisturization can be adequately controlled such that disruptive influences can be suppressed and the moisturization leads to reproducible results.

It has already been reported above that the moisturization, i.e., the infiltration of the condensed process material into the flaws in the oxide layers, is preferably and usefully preceded by a plasma pretreatment. This plasma pretreatment can occur in the moisturizing chamber, with this being operated such that in it the gas atmosphere or a process gas atmosphere for the plasma pretreatment is produced selectively. In particular, this embodiment of the device permits use of the process according to the invention even with small numbers of boards to be soldered with low overhead for the device.

In an advantageous embodiment of the invention, provision is made that the pickling system have a process chamber for the plasma pretreatment of the soldering connection surfaces in addition to the moisturizing chamber.

In a preferred embodiment of the device according to the invention, the device includes, one after another in a series, an evacuation chamber, the process chamber for the plasma pretreatment, an aeration chamber, in which aeration of the plasma pretreated boards with hydrocarbon-free air takes place, and the moisturizing chamber, as well as a wave soldering system for soldering, which generates at least one standing wave of solder, with all the aforementioned chambers designed as pass-through chambers which can be separated from each other by locks. Here, the moisturizing chamber also serves as a preheating device for the soldering process, and the wave soldering system simultaneously forms the heating system for the oxide layers with the infiltrated process material. The soldering system is however not necessarily a wave soldering system; rather it may, for example, even be soldering system with a still soldering bath or a reflow soldering system.

Figure 2:
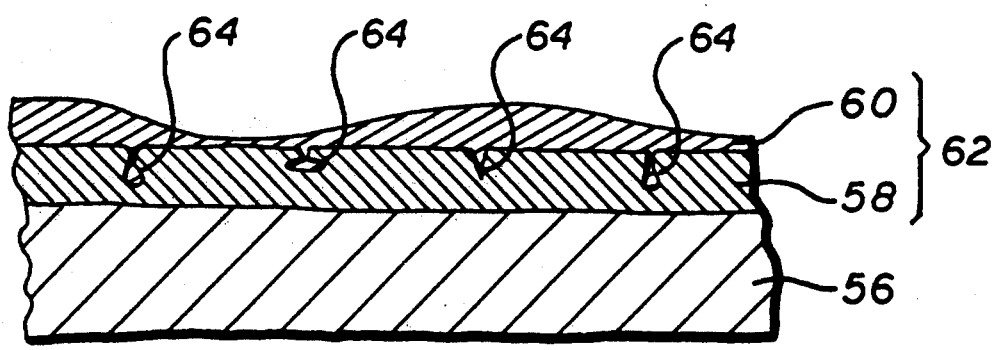
Figure 3:
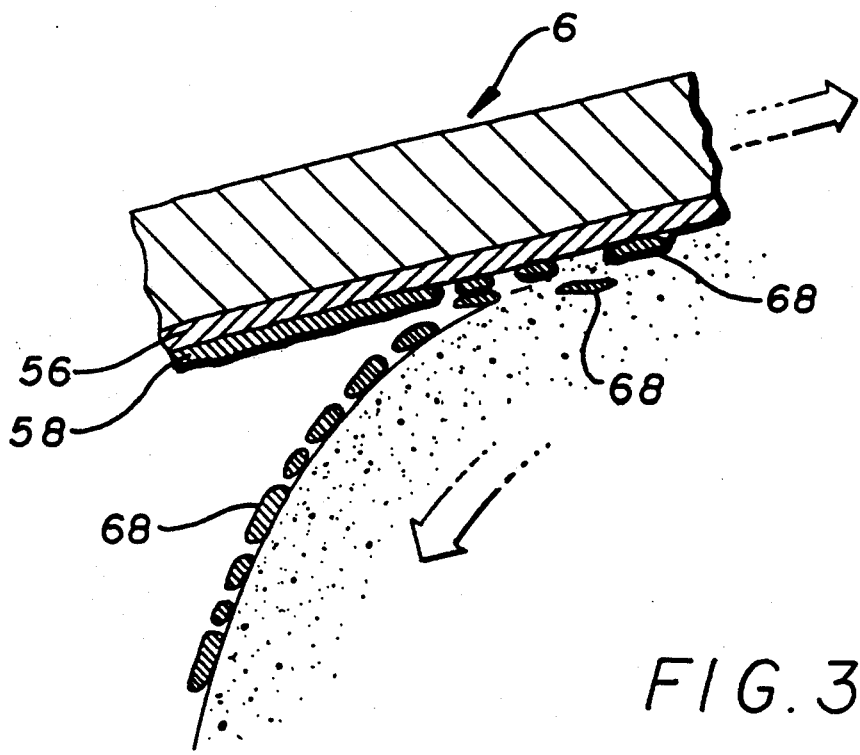

One embodiment of the invention is depicted in the drawings and is explained in greater detail below. The drawings depict:

FIG. 1 a schematic side view, partially cutaway, of a device for soldering electronic boards;

FIG. 2 a schematic, cutaway, lengthwise section through a soldering connection surface with passive layers; and FIG. 3 a schematic representation for explanation of the processes in the rise of a printed circuit board on a wave of solder.

The device depicted in FIG. 1 includes a machine frame 2, which is represented only schematically and which supports all systems of the device. Boards 4 to be soldered pass through the device from left to right in FIG. 1. In the embodiment depicted, each board 4 includes a printed circuit board 6 with devices which are not shown attached, which devices may, for example, be mountable either through holes and/or on the surface. Each printed circuit board 6 may be held by a soldering frame which is not shown.

Transport of the printed circuit boards 6 through the device occurs with the help of sequentially arranged conveyor devices 8, 10, 12, 14, and 16, which are, for example, belt or chain conveyors which engage the lateral edges of the boards. Details of these conveyor devices are not further explained here since the invention does not concern their design. The conveyor device 8 passes the transported board 6 to the conveyor device 10, which passes it to the conveyor device 12, which then passes it to the conveyor device 14, which passes it to the conveyor device 16. The conveyor devices 8, 10, and 12 transport the boards 4 on an essentially horizontal path. The transport path defined by the conveyor device 14 rises slightly toward its downstream end. The conveyor device 16 likewise defines a slightly rising transport path.

The as yet unpickled printed circuit boards 6 with devices attached in the conventional manner are first introduced into an evacuation chamber 18, located on the left end of the device in FIG. 1, where the device is loaded with the boards 6 in any suitable manner. The evacuation chamber 18 is designed as a tunnel-shaped pass-through chamber and accordingly has an intake on its left end and an outlet on its right end. The intake is sealable by means of a first lock 20, which is, for example, designed as a vertically sliding plate. The outlet of the evacuation chamber 18 is sealable by means of a second lock 22, which, like the other locks in the device, may also be designed as a vertically sliding plate. Inside the evacuation chamber 18, the first conveyor device 8 is disposed such that it can transport the board 4 in the manner mentioned through the evacuation chamber 18 from the intake to the outlet. The interior of the evacuation chamber 18 is connected to a vacuum pump 24, with the help of which the evacuation chamber 18 can be evacuated to a desired low pressure when the locks 20 and 22 are closed. This low pressure is, for example, the processing pressure of 30 to 40 Pa inside a yet to be explained process chamber 26 for a plasma pretreatment. The evacuation chamber 18 is further equipped with an aeration system which makes it possible to raise the pressure inside the evacuation chamber 18 back to ambient pressure or to a pressure near ambient pressure.

The process chamber 26 for a plasma pretreatment is connected to the evacuation chamber 18. The process chamber 26 is also equipped as a pass-through chamber with an intake and an outlet, whereby its intake is sealable by means of the same second lock 22 which serves as the lock of the outlet of the evacuation chamber 18. The outlet of the process chamber 26 is sealable by means of a third lock 28. Inside the process chamber 26 is disposed the second conveyor device 10, to which the boards 4 are transferred from the first conveyor device 8 when the first and third locks 20 and 28 respectively are closed and the second lock 22 is open. The process chamber 26 is connected to a vacuum pump 30, with the help of which the inside of the process chamber 26 can be evacuated to the process pressure of, for example, 30 to 40 Pa. Furthermore, it is possible to aerate the process chamber 26. The aeration of the process chamber 26 is however only performed when the entire device is turned off. During operation, the process chamber 26 is always kept at processing pressure and is always filled with process gas, since the feeding of boards 4 to the process chamber 26 and the passage of the boards always occurs out of or into chambers which are evacuated to the process pressure. The process chamber 26 is equipped with devices (not shown) which enable production and maintenance of a low-pressure plasma inside the process chamber 26. These devices (not shown) have gas connections with which the process gas is fed into and removed from the process chamber 26, heaters, with which the process chamber 26 is brought to the process temperature, as well as circulation devices for the process gas which guide it in the loop through the process chamber 26 and, if appropriate, a gas purification system with an absorber, for example.

During operation, a low-pressure plasma, whose process gas consists of $O_2$, $N_2$, $H_2$, $CO_2$, $N_2O$, $H_2O$, or a combination of these gases, is produced and maintained inside the process chamber. The process gas may however even be air. The devices (not shown) for excitation of the plasma may be, for example, magnetrons by means of which the high-frequency energy for generation of the gas plasma is introduced and which are disposed above the conveyor device 10 in the region of the upper wall of the process chamber 26.

More detailed information concerning a process chamber which can be used within the framework of the device described here is found in the earlier German patent applications P 39 36 955.2 and P 40 32 328.5.

An aeration chamber 32, which again is designed as a pass-through chamber with an intake and an outlet, is connected to the process chamber 26. The intake of the aeration chamber 32 is sealable by means of the third lock 23, which simultaneously serves to seal the outlet of the process chamber 26. The outlet of the aeration chamber 32 is sealable by means of a fourth lock 34. The third conveyor device 12, which takes the board from the second conveyor device 10 and passes it on to the fourth conveyor device 14, is disposed inside the aeration chamber 32. The aeration chamber 32 is connected to an additional vacuum pump 36, with the help of which the interior of the aeration chamber can be evacuated to the process pressure of the process chamber 26. The aeration chamber 32 is aerated by hydrocarbon-free air with a specific moisture content under ambient pressure. The aeration chamber 32 is evacuated when the third lock 28 is opened so that the boards 4 can be transferred from the process chamber 26 into the aeration chamber 32. At this time, the two locks 22 and 34 are closed. The aeration chamber 32 is at ambient pressure when the fourth lock 34 is opened so that the boards 4 can be transferred from the aeration chamber 32 into a yet-to-be explained moisturizing chamber 38. At this time, the lock 28 is closed so that the process pressure can always be maintained in the process chamber 26.

The moisturizing chamber 38 is connected directly to the aeration chamber 32. This again is designed as a pass-through chamber and has an intake 40 as well as an outlet 42. Since the interior of the moisturizing chamber 38 is always at ambient pressure during operation, the intake 40 and the outlet 42 are not sealable and are always open. The fourth conveyor device 14, to which the boards 4 are transferred from the third conveyor device 12 when the fourth lock 34 is open, is disposed inside the moisturizing chamber 38. The fourth conveyor device 14 transfers the boards 4 at the outlet 42 to the fifth conveyor device 16. Inside the moisturizing chamber 38 there is a gas atmosphere which consists in the depicted embodiment of air contain water in gaseous phase. Devices (not shown) for conditioning the air atmosphere inside the moisturizing chamber 38 are allocated to the moisturizing chamber 38, which devices provide for the desired conditions, in particular, the desired temperature as well as the desired relative humidity. The temperature is higher than the ambient temperature in a range, for example, from 40° to 50° C. To maintain this temperature which is higher than the ambient temperature, a heater (not shown), which also serves for preheating the boards in preparation for the subsequent actual soldering process, is disposed in the moisturizing chamber.

In the region of the intake 40 of the moisturizing chamber 38, a first nozzle device 44 is disposed. A second nozzle device 46 is disposed in the region of the outlet 42. Purified air is blown out through each of these two nozzle devices so that an air curtain is generated at the intake and the outlet. On one side the gas atmosphere inside the moisturizing chamber 38 is isolated from the environment. On the other side, provision can be made through appropriate temperature control of the air curtain generated by the nozzle device 46 that the temperature of the oxide layers on the soldering connection surfaces of the boards 4 fall below the dew point such that the condensation of the water absorbed into the flaws in the oxide layers is supported by it.

Alternatively to the above-described design of the moisturizing chamber 38, it can be subdivided into two successive chamber sections, whereby the chamber section closer to the outlet 42 is kept at a lower temperature than the first chamber section to support the above-mentioned condensation.

Immediately downstream from the moisturizing chamber 38 in the direction of the passage of the boards 4 is disposed a soldering system 48, which in the embodiment depicted is designed as a wave soldering system. It includes a melting pot 50 which contains molten solder during operation. It also includes two shafts 52 and 54, each of which has on its upper end a slit-shaped delivery opening which runs crosswise to the transport direction Y of the boards 4. Through these shafts, molten solder is delivered upward by means of a pumping device (not shown) such that the solder emerging through the delivery opening forms a standing wave of solder (not shown) at that location. While a board 4 is transported above the soldering system 48, the bottom side of the respective printed circuit board 6 comes into contact with the crest of the wave of solder, such that the bottom side of the printed circuit board is wetted with solder and the SMD devices protruding from the bottom side as well as connections of THM devices are immersed in the solder. The solder wets the surfaces of the parts to be soldered or the soldering connection surfaces and forms the cohesive bonding characteristic.

Not shown in FIG. 1 is a protective gas blower not provided in this embodiment, which [blower] can follow the soldering system 48 and by means of which the solder points are bombarded, with a protective gas, in particular, nitrogen, immediately after the soldering process.

In the above-described device, the evacuation chamber 18, the process chamber 26, the aeration chamber 32, and the moisturizing chamber 38 all belong to the pickling system, in which a two stage pickling process is performed. One stage of this pickling process consists of the plasma pretreatment in the process chamber 26. In it, inorganic and organic passive layers are removed from the oxide layers on the soldering connection surfaces. The other stage of this pickling process is introduced in the moisturizing chamber 38, wherein the gaseous process material is first introduced in the form of water into the flaws in the oxide layers for absorption and then condensed. However, the pickling is not performed until the time in the soldering device 48 when the printed circuit board in question rises on the first wave of solder in the pass-through direction. Not until this time does the sudden heating of the oxide layer with the infiltrated process material occur, whereby the oxide layer is cracked off of the metal basis material of the soldering connection surface. Thus, the soldering system also constitutes the heater of the pickling system.

The fact that the soldering system also constitutes the heater of the pickling system is certainly advantageous, but not essential. Instead, an additional separate heater could be disposed between the moisturizing chamber 38 and the soldering system 48.

In the following, the process for soldering electronic boards by means of the above-described device is explained in greater detail.

The devices to be mounted through holes are attached form-fittingly on a layout suitable for wave soldering. The SMD devices are attached by means of an adhesive, and the entire board is heat treated at a temperature of $T=125°$ C. for a period of 5 min to cure the adhesive. The boards 6 thus prepared are subjected to a dry chemical pretreatment during a first stage of the combined pickling process. In the preferred embodiment described here, this is a plasma pretreatment in a low-pressure plasma with a process pressure in the range from $P=(10$ to $150)$ Pa, a plasma output $J=(0.5$ to $1)$ W/cm$^2$, a process gas volume flow $V=(0.1$ to $3)$ l/hr, a process temperature $T=(20°$ to $100°)$C., and a process or pretreatment period $t=(30$ to $600)$ sec. Possible process gases which may be used are, for example, $O_2$, $N_2$, $H_2$, $CO_2$, or $N_2O$, and suitable combinations of these gases as well as even air. For this, the type of process gas determines the selection of the plasma parameters. The selection of the plasma atmosphere and parameters is based on the type and anticipated thickness of the primarily organic contamination layers on the soldering connection surfaces and on the activation of the surfaces to be soldered required for the solder technology used.

For example, an $H_2$-plasma atmosphere with the process pressure $P=40$ Pa, the process gas volume flow $V=1.5$ l/hr, the plasma output $J=0.7$ W/cm$^2$, and the pretreatment period $t=480$ sec has been successfully used. Also successfully used was an air plasma with the process pressure $P=40$ Pa, the process gas volume flow $V=1.5$ l/hr, the plasma output $J=0.1$ W/cm$^2$, and the pretreatment period $t=240$ sec.

The plasma pretreatment assures homogeneous elimination of the organic passive or contamination layers on the soldering connection surfaces and the activation of the surface of the oxide layers on the soldering connection surfaces required to guarantee good solder distribution and wetting.

FIG. 2 depicts a soldering connection surface schematically in a cutaway section. It has a layered structure whose metal basis material 56 consists, for example, of Sn, SnPb, AgPd, or AgPdBi. Before pickling, an oxide layer 58 consisting of oxides of the metal of the basis material 56 clings to the metal basis material 56. A predominantly organic contamination layer 60 clings to the oxide layer 58. Together, the oxide layer 58 and the organic contamination layer 60 form the passive layers 62 which are removed by pickling.

The soldering connection surfaces freed of the organic contamination layers 60 in the process chamber 26 by the plasma pretreatment and thus the entire board 4 is subsequently forcefully aerated in the aeration chamber 32 with a hydrocarbon-free gas atmosphere. This hydrocarbon-free gas atmosphere can be hydrocarbon-free air. Aeration with nitrogen ($N_2$) has also proven to be suitable. Renewed development of organic impurities should be prevented by the aeration in the aeration chamber 32. This objective can even be attained under suitable conditions if the aeration is performed with ambient air, whereby however the boards should be exposed to the ambient air only for a relatively short period of time, of 30 to 600 sec, for example.

The oxide layer 58, exposed and activated by the plasma pretreatment, which consists, for example, of mixed oxides of SnPb, on the soldering connection surfaces is then forwarded to the second stage of the combined pickling process.

The natural topology of the oxide layer 58 is exposed through the plasma pretreatment. This oxide layer 58 has many flaws 64 whose numbers increase with the thickness of the layer among other things. The entire surface area of these three-dimensional defects in the layer or flaws is much greater than the surface of the projection of the soldering connection surface in question. Valence bonds, which were saturated by the removed organic contamination layer 60, are broken by means of the plasma pretreatment. These broken valence bonds characterize the reactivity of the exposed oxide layer. When the pretreated soldering connection surfaces which have a thermodynamically unstable oxide layer topology are exposed to an atmosphere containing a gaseous condensable process material, homogeneously distributed condensation processes will occur based on the frequency of the three-dimensional defects in the layer. The plasma pretreatment makes the metal oxides hydrophilic. Therefore, the metal oxides are saturated on their surface by condensation of the process material in an appropriate atmosphere of the type mentioned above.

The process described above, wherein the gaseous process material is first absorbed into the flaws and then condensed, can be called moisturization and develops in the moisturization chamber 38, in which a gas atmosphere consisting of air containing water as a process material is present, with a relative humidity of at least 30%. Of course, absorption of atmospheric moisture would also occur spontaneously. However, to increase the volume of the expandable process material, the moisturization is preferably performed in the moisturizing chamber 38 described, which in terms of process technology represents a condensation run. Under standard pressure, the temperature of the water vapor in the moisturizing chamber 38 is 40° to 85° C., preferably 75° to 85° C. The holding time in the moisturizing chamber is, for example, 1 to 30 sec and is preferably closer to the upper end of the range mentioned. In the embodiment described, the condensation run also serves as a preheating zone for the boards 6, so that the boards are also delivered to the subsequent soldering process prepared in terms of temperature. However, care must taken that the condensation temperature of the process material used is higher than the preheating temperature. The condensation of the process material in the flaws 64 is supported by the air curtain generated by the nozzle device 46 at the outlet of the moisturizing chamber 38.

The moisturizing chamber 38 is followed immediately by the soldering system 48 designed as a wave soldering system into which the pretreated boards 4 are introduced in the manner described. For this, the shortest possible paths between the moisturizing chamber 38 and the wave of solder generated by the first shaft 52 are appropriate to prevent losses in absorption and, consequently, losses in pickling. The boards 4 treated in the above-described manner are thus supplied to the first wave of solder (not shown) immediately after the condensation run. The soldering temperature is, for example, 245° C., and the average soldering time is, for example, 5 sec.

FIG. 3 is a schematic, enlarged representation of the condition produced with the rising of the pretreated printed circuit board 6 with attached devices on the wave of solder 66, generated in the soldering system 48 by means of the shaft 52. The wave of solder flows toward the left in FIG. 1, i.e., in the direction of the arrow drawn in the wave of solder 66 in FIG. 3. The printed circuit board 6 runs from left to right in FIGS. 1 and 3 on the wave of solder 66, i.e., in the direction of the arrow drawn in the printed circuit board 6 in FIG. 3. The metal basis material 56 of the soldering connection surface adheres to the bottom side of the board. The oxide layer 58 adheres to this basis material 56 with finitely many discrete saturated oxides, including, for example, mixed oxides of Sn, Pb, and/or SnPb. In the transition area between the oxide layer 58 and the wave of solder 66, there is, at the time of the first contact between them, a relatively great temporal temperature gradient T/t, which should have a value of at least 50 K./s, preferably more than 150 K/s and presumably reaches significantly higher values in the micro-range. The rapid heating of the oxide layer 58 corresponding to the temporal temperature gradient leads to spontaneous vaporization, i.e., expansion in volume of the infiltrated, condensed process material in the flaws 64 in the orthogonal and horizontal flawed region of the oxide layer. The volume of the process material increases, for example, in the case of water ($H_2O$) by a factor of 1,000. In this process, the temporal temperature gradient occurring determines the speed of expansion of the absorbed and condensed process material. This spontaneous expansion in volume causes a microexplosion-like cracking off of the oxide layer 58 from the metal basis material 56, i.e., for example, the layer of SnPb forming the soldering connection surface. This second and final stage of the pickling process takes place immediately upon the linear entry of the bottom side of the printed circuit board 6 with the devices attached into the wave of solder 66, such that the production of virgin soldering connection surfaces occurs virtually simultaneously with the wetting of these soldering connection surfaces by the molten solder and thus no passive layers which restrict wetting interfere with the reproducible formation of the solder points between the SMD devices and/or the THM devices (not shown in FIG. 3) on the one hand and the pad or the pass-through contacts on the printed circuit board 6 on the other hand. This process is depicted schematically in FIG. 3. The microexplosions break the oxide layer 58 into oxide fragments 68, which are also sheared off or lifted off the metal basis material 56 by the microexplosions. The cracked-off oxide fragments 68 leave the solder bonding plane with the passing wave of solder 66, as illustrated by the oxide fragments 68 floating away on the left flank of the wave of solder 66 in FIG. 3. Similarly, as was explained above for a soldering connection surface of the printed circuit board 6, the oxide layers are cracked off the soldering connection surfaces of the devices.

The fresh solder points leaving the second wave of solder generated by the shaft 54 are preferably exposed to a protective gas atmosphere with the help of which the solder point topology can be favorably modified. This protective gas is, for example, nitrogen ($N_2$).

The effect of the above-described pickling process can be quantitatively influenced through the volume of the absorbed process material and the temperature profile of the soldering system 48, in particular, the temperature gradient T/t.

In the process according to the invention for soldering electronic boards, in particular printed circuit boards with devices installed on them, during the pickling process, first, a condensable process material, for example, water, is introduced for absorption into flaws in the oxide layers on the soldering connection surfaces and at least partially condensed in the flaws. Then, the oxide layers are exposed to rapid heating such that the process material condensed in the flaws vaporizes explosively and thus the oxide layer breaks up and cracks off the metal basis material such that the soldering connection surfaces are brought into virgin condition for the subsequent actual soldering process. In the case of wave soldering, the rapid heating occurs preferably by means of the wave of solder itself. If non-oxide passive layers also must be pickled, this occurs preferably in a preceding stage of the pickling process during which the oxide layer is hydrophilized. A plasma pretreatment is suitable for this. The device according to the invention has a moisturizing chamber in which the condensable process material is supplied to the hydrophilic oxide layers and absorbed by them.

We claim:

1. In a process for soldering electronic boards, which includes the steps of: subjecting the boards to a pickling process wherein oxide layers present on the soldering connection surfaces are largely removed; and soldering the boards by wetting metal soldering connection surfaces with molten solder, the improvement wherein, during the pickling process, the entire board is first exposed to a gas atmosphere containing a condensable process material in a gaseous phase, causing absorption of the gaseous process material into flaws in the oxide layers; at least partially condensing said gaseous process material in the flaws; and then heating the oxide layers to explosively vaporize the condensed process material in the flaws whereby the oxide layer breaks up and cracks off the metal basis material.

2. The process according to claim 1, characterized in that the process material is water.

3. The process according to claim 1, characterized in that the process material is selected from the group consisting of methanol, acetone, and ethanol.

4. The process according to claim 2, characterized in that the gas atmosphere is air with a specific water content as the process material.

5. The process according to claim 1, characterized in that the temporal temperature gradient in the oxide layer with the absorbed process material reaches a value of more than 50 K./s during its heating.

6. The process according to claim 5, characterized in that the temporal temperature gradient reaches a value of more than 150 K./s.

7. The process according to claim 1, characterized in that heating of the oxide layer with the absorbed process material occurs separately in time before the soldering process.

8. The process according to claim 1, characterized in that the heating of the oxide layer with the absorbed process material occurs during the soldering process by means of heat energy delivered by the solder.

9. The process according to claim 8, further comprising the step of transporting the individual boards over at least one standing wave of solder and simultaneously contacting the underside of the individual boards with a crest of the wave of solder to heat the oxide layer with the absorbed process material therein for the purpose of cracking off the oxide layer.

10. The process according to claim 1, further comprising the step of pretreating the boards during the pickling process for removal of passive layers on the oxide layers before causing the absorption of the process material.

11. The process according to claim 10, characterized in that the pretreatment comprises wet chemical cleansing.

12. The process according to claim 10, characterized in that the pretreatment comprises exposing the soldering connection surfaces to a plasma.

13. The process according to claim 12, characterized in that the process gas of the plasma consists of $O_2$, $N_2$, $H_2$, $CO_2$, $N_2O$, or $H_2O$, or a combination of these gases.

14. The process according to claim 13, characterized in that the process gas is air.

15. The process according to claim 12, characterized in that the plasma pretreatment occurs in a low-pressure plasma with a process pressure $P=(10$ to $150)$ Pa, a plasma output $J=(0.5$ to $1)$ W/cm$^2$, a process gas volume flow $V=(0.1$ to $3)$ liter/hr, a process temperature $T=(20°$ to $100°)$C., and a pretreatment period $t=(30$ to $600)$ sec.

16. The process according to claim 12, comprising the further step of aerating the board in hydrocarbon-free air with a specific humidity between the plasma pretreatment and the absorption of the process material.

17. The process according to claim 1, comprising the further step of exposing the soldered points to a protective gas atmosphere immediately after the soldering process.

18. The process according to claim 17, characterized in that the primary component of the protective gas is nitrogen.

* * * * *